(12) United States Patent
Tanaka et al.

(10) Patent No.: US 7,429,296 B2
(45) Date of Patent: Sep. 30, 2008

(54) METHOD FOR MANUFACTURING PHOTOCONDUCTIVE LAYER CONSTITUTING RADIATION IMAGING PANEL

(75) Inventors: Motoyuki Tanaka, Kanagawa-ken (JP); Kiyoteru Miyake, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 266 days.

(21) Appl. No.: 11/087,650

(22) Filed: Mar. 24, 2005

(65) Prior Publication Data

US 2005/0214447 A1    Sep. 29, 2005

(30) Foreign Application Priority Data

Mar. 24, 2004  (JP) .............................. 2004/086142
Mar. 14, 2005  (JP) .............................. 2005/070909

(51) Int. Cl.
*C30B 15/14* (2006.01)
*B32B 9/00* (2006.01)
*A61B 6/00* (2006.01)

(52) U.S. Cl. ........................... 117/3; 428/702; 428/701; 250/582

(58) Field of Classification Search ..................... 117/3; 428/701, 702; 250/582
See application file for complete search history.

(56) References Cited

U.S. PATENT DOCUMENTS

| | | | | |
|---|---|---|---|---|
| 3,775,142 A | * | 11/1973 | Roup | 501/134 |
| 4,971,946 A | * | 11/1990 | Taylor et al. | 505/490 |
| 5,523,284 A | * | 6/1996 | Fagan et al. | 505/501 |
| 6,016,414 A | * | 1/2000 | Anayama et al. | 399/159 |
| 6,268,614 B1 | * | 7/2001 | Imai | 250/591 |
| 6,455,867 B2 | * | 9/2002 | Ogawa | 250/580 |
| 6,891,184 B2 | * | 5/2005 | Imai | 250/591 |
| 7,002,173 B2 | * | 2/2006 | Imai | 250/582 |
| 2004/0104362 A1 | * | 6/2004 | Imai | 250/582 |
| 2004/0104365 A1 | * | 6/2004 | Imai | 250/591 |
| 2005/0214582 A1 | * | 9/2005 | Miyake | 428/702 |
| 2006/0197009 A1 | * | 9/2006 | Yamaguchi | 250/214.1 |
| 2006/0208207 A1 | * | 9/2006 | Irisawa | 250/580 |
| 2006/0290994 A1 | * | 12/2006 | Miyake | 358/300 |
| 2007/0012890 A1 | * | 1/2007 | Irisawa | 250/581 |

FOREIGN PATENT DOCUMENTS

| JP | 11-237478 A | 8/1999 |
|---|---|---|
| JP | 2000-249769 A | 9/2000 |

OTHER PUBLICATIONS

English Translation for JP 2000-249769 (already cited in IDS).*
English Translation for JP 11-237478 (already cited in IDS).*

* cited by examiner

*Primary Examiner*—Robert M. Kunemund
*Assistant Examiner*—G. Nagesh Rao
(74) *Attorney, Agent, or Firm*—Sughrue Mion, PLLC

(57) ABSTRACT

A photoconductive layer formed of a $Bi_{12}MO_{20}$ sintered body is manufactured without being fused with a setter. An oxide material in which a content of silicon oxide is 1 wt %, and more preferably, 0.3 wt % or less, is used as a setter which mounts a $Bi_{12}MO_{20}$ molded body (where M is at least one of Ge, Si and Ti) thereon.

4 Claims, 6 Drawing Sheets

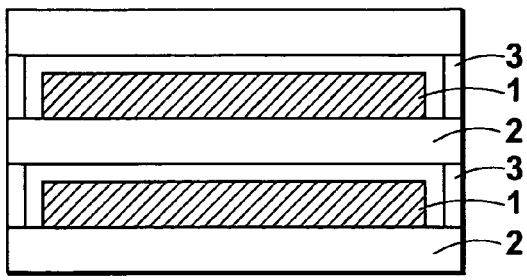
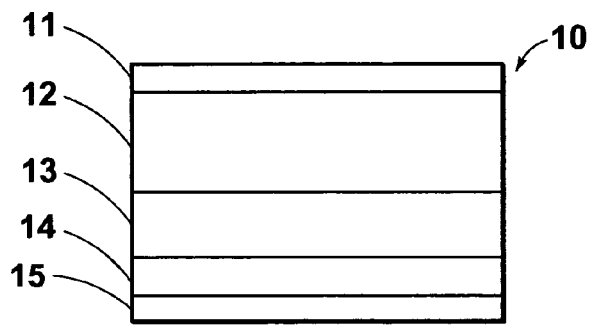
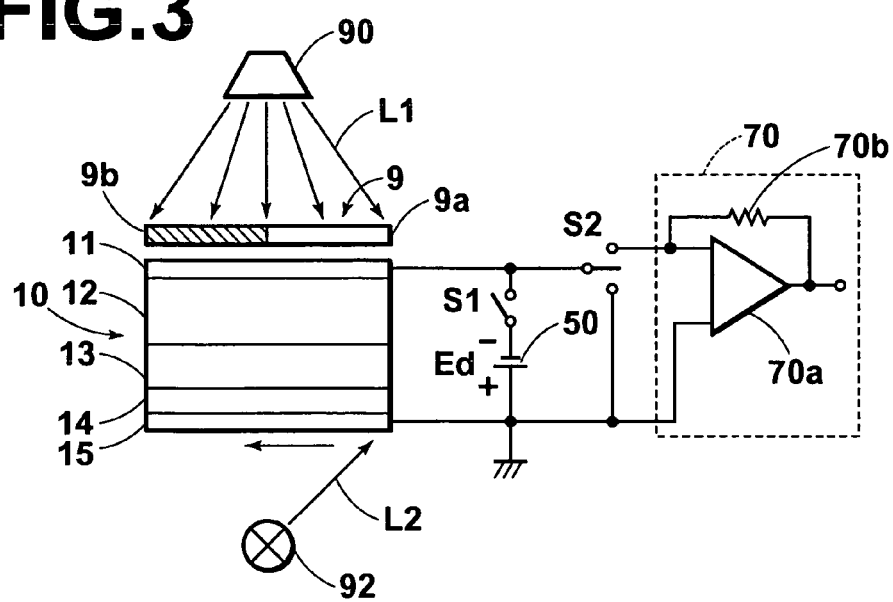

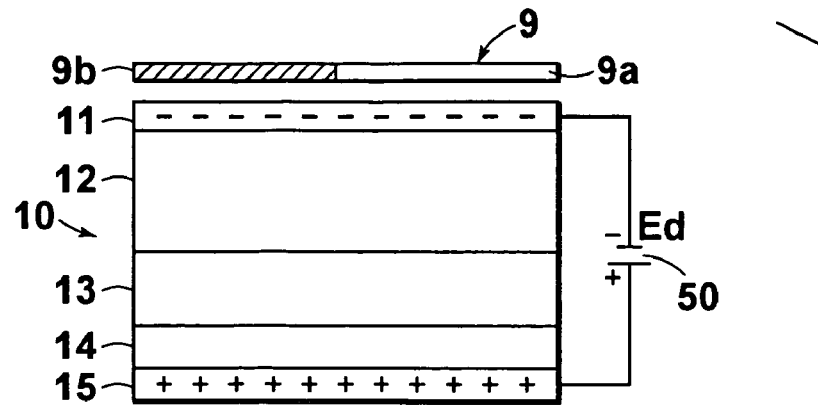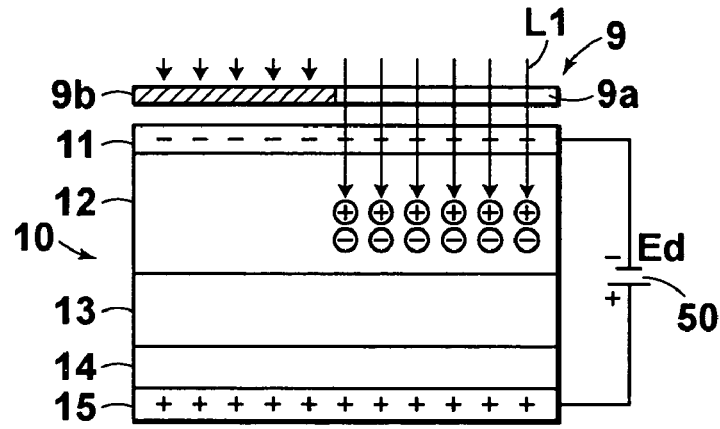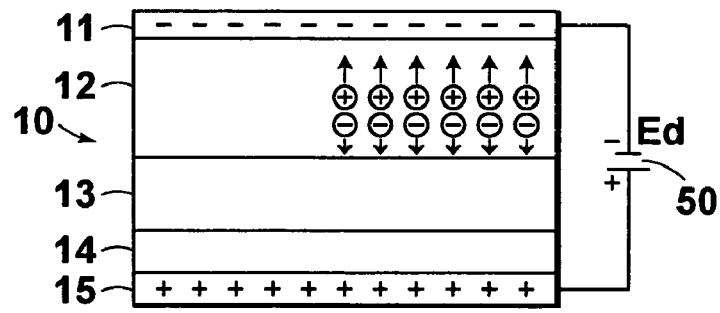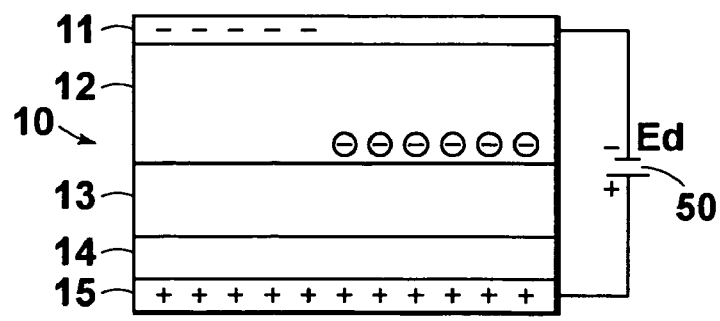

METHOD FOR MANUFACTURING PHOTOCONDUCTIVE LAYER CONSTITUTING RADIATION IMAGING PANEL

BACKGROUND OF THE INVENTION

1. Field of the Invention

The present invention relates to a radiation imaging panel suitable for application to a radiation imaging apparatus using an X-ray and the like, and specifically to a method for manufacturing a photoconductive layer constituting the radiation imaging panel.

2. Description of the Related Art

Heretofore, in medical X-ray imaging, an X-ray imaging panel has been known, which uses a photoconductive layer sensitive to an X-ray as a photosensitive member for the purpose of reducing a dose of radiation exposed to a subject, improving diagnostic performance, and so on, reads an electrostatic latent image formed on the photoconductive layer by the X-ray by means of light or a large number of electrodes, and records the image thus read. A method using the X-ray imaging panel is superior in that resolution thereof is higher than fluorography by a television camera tube, which is a well-known imaging method.

The above-described X-ray imaging panel is constituted to generate charges corresponding to X-ray energy by irradiating a charge generation layer provided therein with the X-ray, and to read the generated charges as electric signals. The above-described photoconductive layer acts as the charge generation layer. Heretofore, amorphous selenium has been used for the photoconductive layer. However, X-ray absorptivity of the amorphous selenium is low in general. Accordingly, it is necessary that thickness of the photoconductive layer be formed thick (for example, 500 µm or more).

However, charge collection efficiency of the photoconductive layer decreases when such film thickness thereof is thickened. Accordingly, it is necessary to apply high voltage to the photoconductive layer. However, in this case, there is a problem that charges caused by dark current are prone to occur, which thereby decrease a contrast in a low-dose range and cause device deterioration. Moreover, there is a problem that noise (structure noise) resulting from variations in the thickness direction of the selenium is prone to be picked up. Furthermore, the photoconductive layer is usually formed by an evaporation method, and accordingly, it takes a considerable time to grow the photoconductive layer until the photoconductive layer reaches the thickness as described above, and a management for such a growing process is also cumbersome. These factors eventually lead to an increase of manufacturing cost of the photoconductive layer, which bring about an increase of cost of the X-ray imaging panel.

Considering the problems as described above, other materials of the photoconductive layer than the selenium are studied. For example, in Japanese Unexamined Patent Publication Nos. 11(1999)-237478 and 2000-249769, as a material constituting the photoconductive layer, a bismuth oxide-series complex oxides represented by a composition formula $Bi_xMO_y$ (where M is at least one of Ge, Si and Ti, x is the number satisfying a condition $10 \leq x \leq 14$, and y represents the stoichiometric atomic number of oxygen according to M and x which are described above) is described. In accordance with the bismuth oxide-series complex oxides, it can be expected that charge conversion efficiency of the X-ray is improved.

Incidentally, in the above-described Japanese Unexamined Patent Publication Nos. 11(1999)-237478 and 2000-249769, the following is described as a method for forming the photoconductive layer. Specifically, sol or gel obtained by performing hydrolysis for alkoxides of bismuth and the metal is subjected to a sintering treatment, and the sol or gel thus sintered is dispersed and coated.

However, in general, there are limitations on a filling factor of a photoconductive substance of the photoconductive layer which can be formed by the coating. Accordingly, in the photoconductive layer formed by the coating as described above, an effect of inhibiting a movement of the generated charges by a binder is large, and electric noise is increased. Therefore, there is a problem that image granularity is deteriorated.

SUMMARY OF THE INVENTION

The present invention has been made in consideration of the circumstances as described above. It is an object of the present invention to provide a novel method for manufacturing a photoconductive layer formed of bismuth oxide sintered bodies.

A method according to the present invention for manufacturing a photoconductive layer formed of a Bi oxide sintered body, the photoconductive layer constituting a radiation imaging panel which records radiation image information as an electrostatic latent image is one characterized in that an oxide material is used as a setter when the Bi oxide sintered body is sintered. Here, Bi oxide refers to $Bi_2O_3$ and Bi complex oxides, such as $Bi_{12}MO_{20}$ (where M is at least one of Ge, Si, and Ti).

The oxide material is an oxide of which melting point is 900° C. or more. It is preferable that a content of silicon oxide therein be 1 wt % or less, and it is more preferable that the content be 0.3 wt % or less. As a specific oxide material, an aluminum oxide sintered body, a zirconium oxide sintered body or single crystal of aluminum oxide is given.

The method according to the present invention for manufacturing a photoconductive layer formed of a Bi oxide sintered body uses the oxide material as the setter when the Bi oxide sintered body is sintered. Accordingly, it is possible to manufacture the Bi oxide sintered body at relatively low cost. Moreover, the content of silicon oxide in the oxide material is set at 1 wt % or less, and further preferably, at 0.3 wt % or less, thus making it possible to manufacture the Bi oxide sintered body without fusing the Bi oxide sintered body with the setter.

In particular, in the case of using the aluminum oxide sintered body or the zirconium oxide sintered body as the oxide material, the Bi oxide sintered body can be manufactured at low cost without being fused with the setter.

Moreover, in the case of using the single crystal of aluminum oxide as the oxide material, even if the Bi oxide sintered body is sintered at such sintering temperature at which platinum to be used as the setter in general causes fusion, the Bi oxide sintered body can be manufactured without being fused with the setter.

BRIEF DESCRIPTION OF THE DRAWINGS

FIG. 1 is a constitutional cross-sectional view schematically showing a method for manufacturing a Bi oxide sintered body.

FIG. 2 is a cross-sectional view showing an embodiment of a radiation imaging panel including a photoconductive layer manufactured by a manufacturing method of the present invention.

FIG. 3 is a constitutional view schematically showing a recording/reading system using the radiation imaging panel.

FIGS. 4A to 4D are views showing a process of recording an electrostatic latent image in the recording/reading system based on a charge model.

DESCRIPTION OF THE PREFERRED EMBODIMENT

Figure 5A:
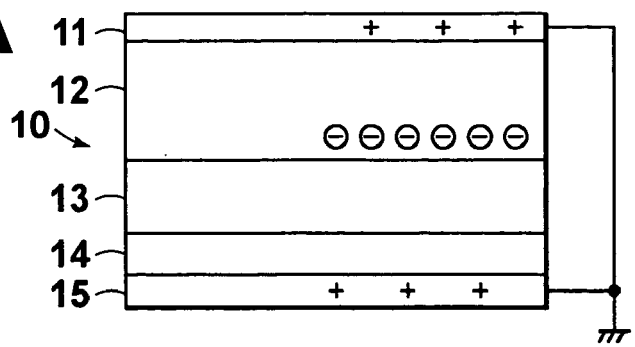
FIGS. 5A to 5D are views showing a process of reading the electrostatic latent image in the recording/reading system based on a charge model.
Figure 5B:
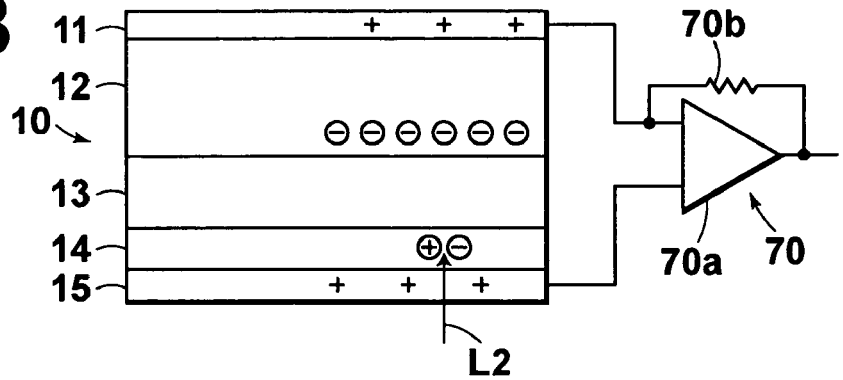
Figure 5C:
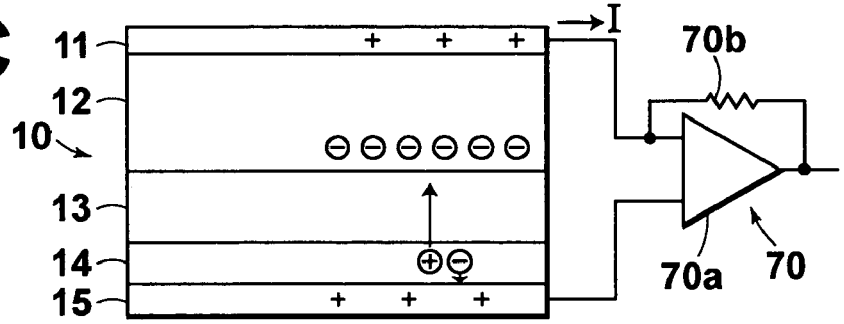

A method according to the present invention for manufacturing a photoconductive layer formed of a Bi oxide sintered body constituting a radiation imaging panel which records radiation image information as an electrostatic latent image is characterized in that an oxide material is used as a setter when the Bi oxide sintered body is sintered. The setter is a stage on which a body to be fired (molded body) is mounted at the time of sintering. In FIG. 1 is a constitutional cross-sectional view schematically showing the method according to the present invention for manufacturing the Bi oxide sintered body.

FIG. 1 shows a state before the sintering is started, where bodies 1 to be fired are mounted on setters 2 assembled into shelves with support pillars 3 interposed therebetween. Each body 1 to be fired is a planer molded body of the Bi oxide sintered body before being sintered (which becomes the photoconductive layer after being sintered). The body 1 to be fired is one obtained by molding $Bi_{12}MO_{20}$ powder (where M is at least one of Ge, Si, and Ti) by a molding method such as a press molding method and a doctor blade method. Here, the $Bi_{12}MO_{20}$ powder is obtained by mixing a bismuth oxide powder or a Bi complex oxide powder, for example, bismuth oxide powder, with silicon oxide powder, germanium oxide powder or titanium oxide powder, followed by preliminary firing. Each setter 2 is an oxide material, and one is preferable, in which a content of the silicon oxide is 1 wt % or less, and further, 0.3 wt % or less. As a specific setter, a sintered body of aluminum oxide, a sintered body of zirconium oxide or single crystal of aluminum oxide is given.

A plurality of support pillars 3 are arranged at a predetermined interval in the vicinity of an outer periphery of each setter, and the body 1 to be fired is mounted on the setter 2 while being surrounded by the support pillars 3. Note that, at the time of sintering, the body to be fired may also be fired in a state where a weight plate is put thereon. Sintering temperature cannot be completely determined because the sintering temperature differs depending on a type of the body to be fired, a type of the setter, a combination of the body to be fired and the setter, and the like. However, it is preferable that the sintering temperature be 800° C. to 900° C. In the case of sintering, at such a high temperature, a setter formed of a platinum material usually used for the sintering, fusion occurs between the setter and the body to be fired, and the Bi oxide sintered body cannot be obtained. However, use of the above-described oxide materials for the setter 2 makes it possible to sinter the body 1 to be fired, without being fused with the setter 2.

In the radiation imaging panel, there are those according to a direct conversion system which directly converts a radiation into charges and accumulates the charges converted, and those according to an indirect conversion system which converts the radiation once into light by a scintillator of CsI and the like, then converts the light into charges by an a-Si photodiode, and accumulates the charges thus converted. The photoconductive layer manufactured by the manufacturing method of the present invention is one used for the former radiation imaging panel according to the direct conversion system. Note that, besides the X-ray, a γ-ray, an α-ray and the like are usable as the radiation.

Moreover, the photoconductive layer manufactured by the manufacturing method of the present invention can be used for a so-called optical reading system which reads a radiation image by a radiation image detection unit utilizing a semiconductor material which generates charges by being irradiated with light. Furthermore, the photoconductive layer can be used for a system (hereinafter, referred to as a TFT system) which accumulates charges generated by irradiation of the radiation and reads the accumulated charges by switching on/off electrical switches for each pixel such as thin film transistors (TFTs).

First, as an example, a radiation imaging panel for use in the former optical reading system will be described. FIG. 2 is a cross-sectional view showing an embodiment of the radiation imaging panel including the photoconductive layer manufactured by the manufacturing method of the present invention.

The radiation imaging panel 10 is one formed by stacking, in the following order, a first conducting layer 11 which has transparency to a recording radiation L1 to be described later, a recording radiation-conductive layer 12 which exhibits conductivity by receiving irradiation of the radiation L1 having transmitted through the conductive layer 11, a charge transportation layer 13 which acts as a substantial insulator to charges (charges of a latent image polarity; for example, negative charges) charged in the conductive layer 11 and acts as a substantial conductor to charges (charges of a polarity in transportation; positive charges in the above-described example) reverse in polarity to the above-described charges, a reading photoconductive layer 14 which exhibits conductivity by receiving irradiation of reading light L2 to be described later, and a second conductive layer 15 which has transparency to the reading light L2.

Here, as the conductive layers 11 and 15, for example, one (NESA film or the like) in which a conductive substance is evenly coated on a transparent glass plate is suitable. In the charge transportation layer 13, a larger difference between mobility of the negative charges charged in the conductive layer 11 and mobility of the positive charges reverse thereto in polarity is preferable. As the charge transportation layer 13, suitable is an organic compound such as poly(N-vinylcarbazol) (PVK), N,N'-diphenyl-N,N'-bis(3-methylphenyl)-[1,1'-biphenyl]-4, 4'-diamine (TPD) and discotic liquid crystal, a polymer (polycarbonate, polystyrene or PVK) dispersion, a semiconductor substance such as a-Se doped with Cl of 10 to 200 ppm, or the like. In particular, the organic compound (PVK, TPD, discotic liquid crystal or the like) is preferable because the organic compound has photo-insensitivity. Moreover, a dielectric constant of the organic compound is low in general, and accordingly, capacities of the charge transportation layer 13 and the reading photoconductive layer 14 are reduced, and signal extraction efficiency at the time of reading thereof can be increased.

For the reading photoconductive layer 14, suitable is a photoconductive substance containing, as a main component, at least one of a-Se, Se—Te, Se—As—Te, metal-free phthalocyanine, metal phthalocyanine, magnesium phthalocyanine (MgPc), phase II of vanadyl phthalocyanine (VoPc), copper phthalocyanine (CuPc) and the like.

For the recording radiation-conductive layer 12, the photoconductive layer formed of the $Bi_{12}MO_{20}$ sintered body manufactured by the manufacturing method of the present invention is used. Specifically, the photoconductive layer manufactured by the manufacturing method of the present invention is the recording radiation-conductive layer.

Subsequently, a system using light for the purpose of reading an electrostatic latent image will be briefly described. FIG. 3 is a constitutional view schematically showing a recording/reading system (one formed by integrating an electrostatic latent image recording apparatus and an electrostatic latent image reading apparatus) using the radiation imaging panel 10. This recording/reading system is formed of the radiation imaging panel 10, a recording irradiation means 90, a power source 50, current detecting means 70, reading exposure means 92, and connecting means S1 and S2. The electrostatic latent image recording apparatus portion is formed of the radiation imaging panel 10, the power source 50, the recording irradiation means 90, and the connecting means S1. The electrostatic latent image reading apparatus portion is formed of the radiation imaging panel 10, the current detecting means 70, and the connecting means S2.

The conductive layer 11 of the radiation imaging panel 10 is connected to a negative electrode of the power source 50 through the connecting means S1, and moreover, is also connected to one end of the connecting means S2. One of the other ends of the connecting means S2 is connected to the current detecting means 70. The conductive layer 15 of the radiation imaging panel 10, a positive electrode of the power source 50 and the other of the other ends of the connecting means S2 are grounded. The current detecting means 70 is formed of a feedback resistor 70b and a detection amplifier 70a composed of an operational amplifier, and constitutes a so-called current/voltage conversion circuit.

An object 9 is placed on an upper surface of the conductive layer 11. The object 9 has a portion 9a which has transparency to the radiation L1 and a shielding portion (light-shielding portion) 9b which does not have transparency. The recording irradiation means 90 is one which evenly exposes and irradiates the object 9 with the radiation L1. The reading exposure means 92 is one which scans and exposes the object 9 with the reading light L2 such as an infrared laser beam and light from an LED and an EL cell in a direction of an arrow in FIG. 3. It is desirable that the reading light L2 have a beam shape converged to a thin diameter.

A process of recording the electrostatic latent image in the recording/reading system constituted as described above will be described below while referring to a charge model (FIG. 4). In FIG. 3, the connecting means S1 is switched to an open state (that is, the connecting means S2 is not connected to either the ground or the current detecting means 70), and the connecting means S2 is switched on to apply direct voltage Ed by the power source 50 between the conductive layer 11 and the conductive layer 15. Then, negative charges are charged from the power source 50 to the conductive layer 11, and positive charges are charged therefrom to the conductive layer 15 (refer to FIG. 4A). In such a way, between the conductive layers 11 and 15 in the radiation imaging panel 10, an electric field in parallel thereto is formed.

Next, the object 9 is evenly exposed and irradiated with the radiation L1 from the recording irradiation means 90. The radiation L1 transmits through the transmitting portion 9a of the object 9, and further transmits through the conductive layer 11. The radiation-conductive layer 12 comes to exhibit the conductivity by receiving the radiation L1 which has thus transmitted. This is understood by the following: the radiation-conductive layer 12 acts as a variable resistor which indicates a variable resistance value in accordance with a dose of the radiation L1. The resistance value depends on the following: charge pairs of electrons (negative charges) and holes (positive charges) are generated by the radiation L1. When the dose of the radiation L1 which has transmitted through the object 9 is small, the radiation-conductive layer 12 indicates a large resistance value (refer to FIG. 4B). Note that the negative charges (−) and the positive charges (+), which are generated by the radiation L1, are shown to circle symbols − and + in the drawing.

The positive charges generated in the radiation-conductive layer 12 move through the radiation-conductive layer 12 toward the conductive layer 11 at high speed, and perform charge recombination with the negative charges charged in the conductive layer 11 on an interface between the conductive layer 11 and the radiation-conductive layer 12. Then, the positive charges disappear (refer to FIGS. 4C and 4D). Meanwhile, the negative charges charged in the radiation-conductive layer 12 move through the radiation-conductive layer 12 toward the charge transportation layer 13. The charge transportation layer 13 acts as the insulator to the same charges (negative charges in this example) in polarity as the charges charged in the conductive layer 11. Accordingly, the negative charges which have moved through the radiation-conductive layer 12 stop on an interface between the radiation-conductive layer 12 and the charge transportation layer 13, and are accumulated on the interface (refer to FIGS. 4C and 4D). A quantity of the accumulated charges is determined by a quantity of the negative charges generated in the radiation-conductive layer 12, that is, by the dose of the radiation L1 which has transmitted through the object 9.

Meanwhile, the radiation L1 does not transmit through the light-shielding portion 9b of the object 9, and accordingly, a portion of the radiation imaging panel 10, which is below the light-shielding portion 9b, does not cause any change (refer to FIGS. 4B to 4D). As described above, the object 9 is exposed and irradiated with the radiation L1, thus making it possible to accumulate charges in accordance with an image of the object in the interface between the radiation-conductive layer 12 and the charge transportation layer 13. Note that the image of the object, which is formed by the charges thus accumulated, is referred to as the electrostatic latent image.

Next, a process of reading the electrostatic latent image will be described while referring to a charge model (FIG. 5). The connecting means S1 is opened to stop a supply of the power source, the connecting means S2 is connected once to the ground side, and the conductive layers 11 and 15 of the radiation imaging panel 10 in which the electrostatic latent image is recorded are charged to the same potential, thereby rearranging the charges (refer to FIG. 5A). Thereafter, the connecting means S2 is connected to the current detecting means 70 side.

When the conductive layer 15 side of the radiation imaging panel 10 is scanned and exposed with the reading light L2 by the reading exposure means 92, the reading light L2 transmits through the conductive layer 15, and the photoconductive layer 14 irradiated with the reading light L2 which has thus transmitted comes to exhibit the conductivity in accordance with the scanning and exposure. This phenomenon depends on the fact that pairs of positive and negative charges are generated by receiving irradiation of the reading light L2 as in the case where the above-described radiation-conductive layer 12 exhibits the conductivity because the pairs of positive and negative charges are generated by receiving the irradiation of the radiation L1 (refer to FIG. 5B). Note that, as in the recording process, the negative charges (−) and the positive charges (+), which are generated by the reading light L2, are shown to circle symbols − and + in the drawing.

Figure 5D:
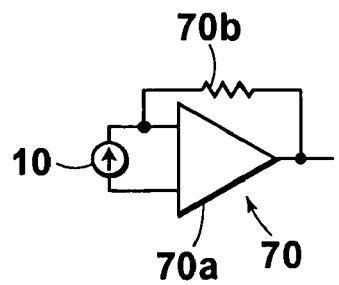

The charge transportation layer 13 acts as the conductor to the positive charges. Accordingly, the positive charges generated in the photoconductive layer 14 move rapidly in a manner of being attracted by the accumulated charges, and perform the charge recombination with the accumulated charges on the interface between the radiation-conductive layer 12 and the charge transportation layer 13. Then, the positive charges disappear (refer to FIG. 5C). Meanwhile, the negative charges generated in the photoconductive layer 14 perform the charge recombination with the positive charges of the conductive layer 15, and then disappear (refer to FIG. 5C). The photoconductive layer 14 is scanned and exposed with a sufficient quantity of light by the reading light L2, and the accumulated charges accumulated on the interface between the radiation-conductive layer 12 and the charge transportation layer 13, that is, the electrostatic latent image is made to entirely disappear by the charge recombination. The above-described fact that the charges accumulated in the radiation imaging panel 10 disappear means that a current I generated by the movement of the charges has flown in the radiation imaging panel 10, and this state can be shown by an equivalent circuit as shown in FIG. 5D, in which the radiation imaging panel 10 is represented by a current source in which a quantity of current depends on a quantity of the accumulated charges.

As described above, the current flowing out of the radiation imaging panel 10 is detected while scanning and exposing the radiation imaging panel 10 concerned with the reading light L2, thus making it possible to sequentially read the quantities of accumulated charges of the respective portions (corresponding to the pixels) scanned and exposed. In such a way, the electrostatic latent image can be read. Note that the above-described operation of detecting the radiation is described in Japanese Unexamined Patent Publication No. 2000-105297 and the like.

Figure 6:
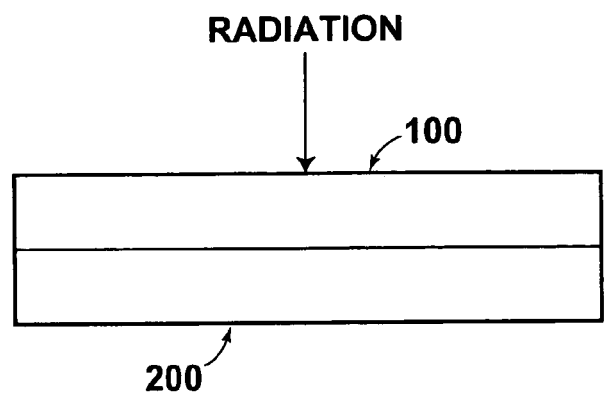
FIG. 6 is a schematic diagram showing a state where a radiation detection unit and an AMA substrate are united together.
Figure 7:
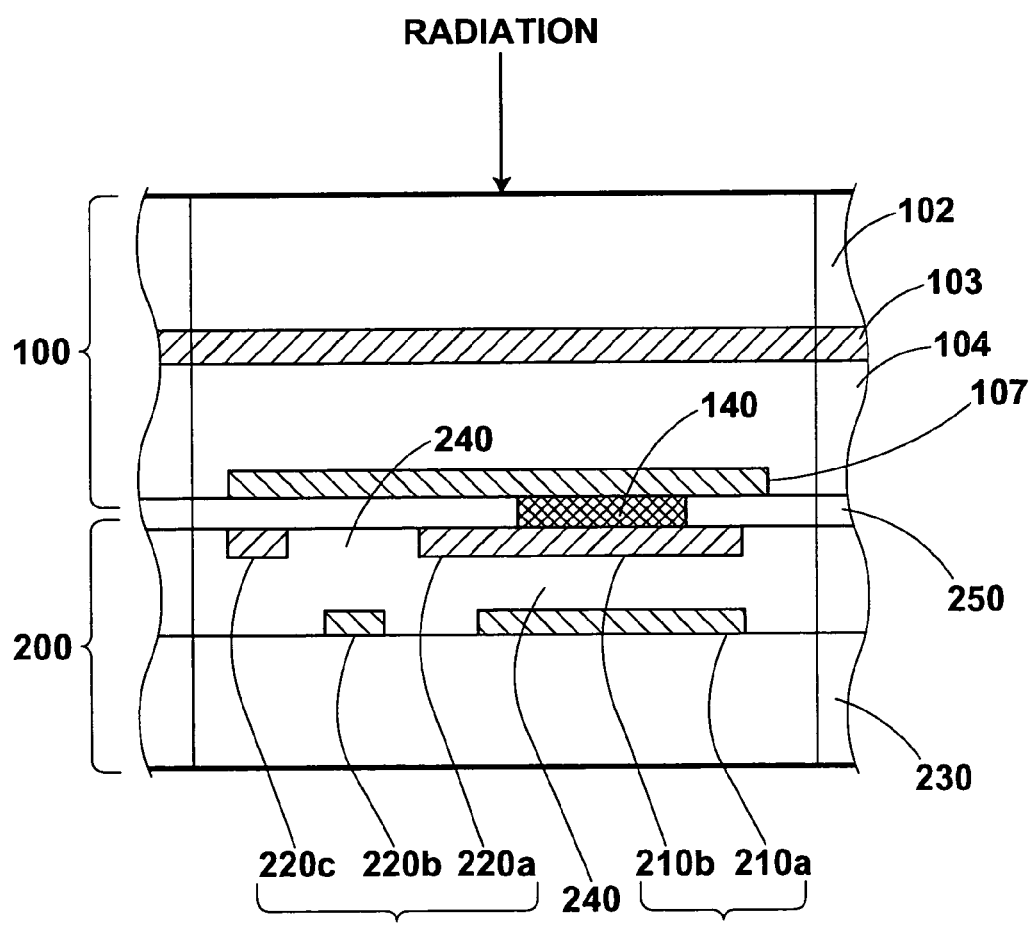
FIG. 7 is a cross-sectional view schematically showing a pixel portion of the radiation detection unit.

Next, a radiation imaging panel in accordance with the latter TFT system will be described. As shown in FIG. 6, the radiation imaging panel has a structure in which a radiation detection unit 100 and an active matrix array substrate (hereinafter, referred to as an AMA substrate) 200 are joined together. As shown in FIG. 7, broadly speaking, the radiation detection unit 100 has a constitution in which a common electrode 103 for applying a bias voltage, a photoconductive layer 104 which generates carriers as pairs of electrons and holes upon sensing the radiation to be detected, and a detection electrode 107 for collecting the carriers, are formed in a stacked manner in order from an incident side of the radiation. A radiation detection unit support 102 may be provided on the common electrode.

The photoconductive layer 104 is manufactured by the manufacturing method of the present invention. For example, each of the common electrode 103 and the detection electrode 107 is formed of a conductive material such as indium tin oxide (ITO), Au and Pt. A hole implantation inhibiting layer and an electron implantation inhibiting layer may be added to the common electrode 103 and the detection electrode 107 in accordance with a polarity of the bias voltage.

Figure 8:
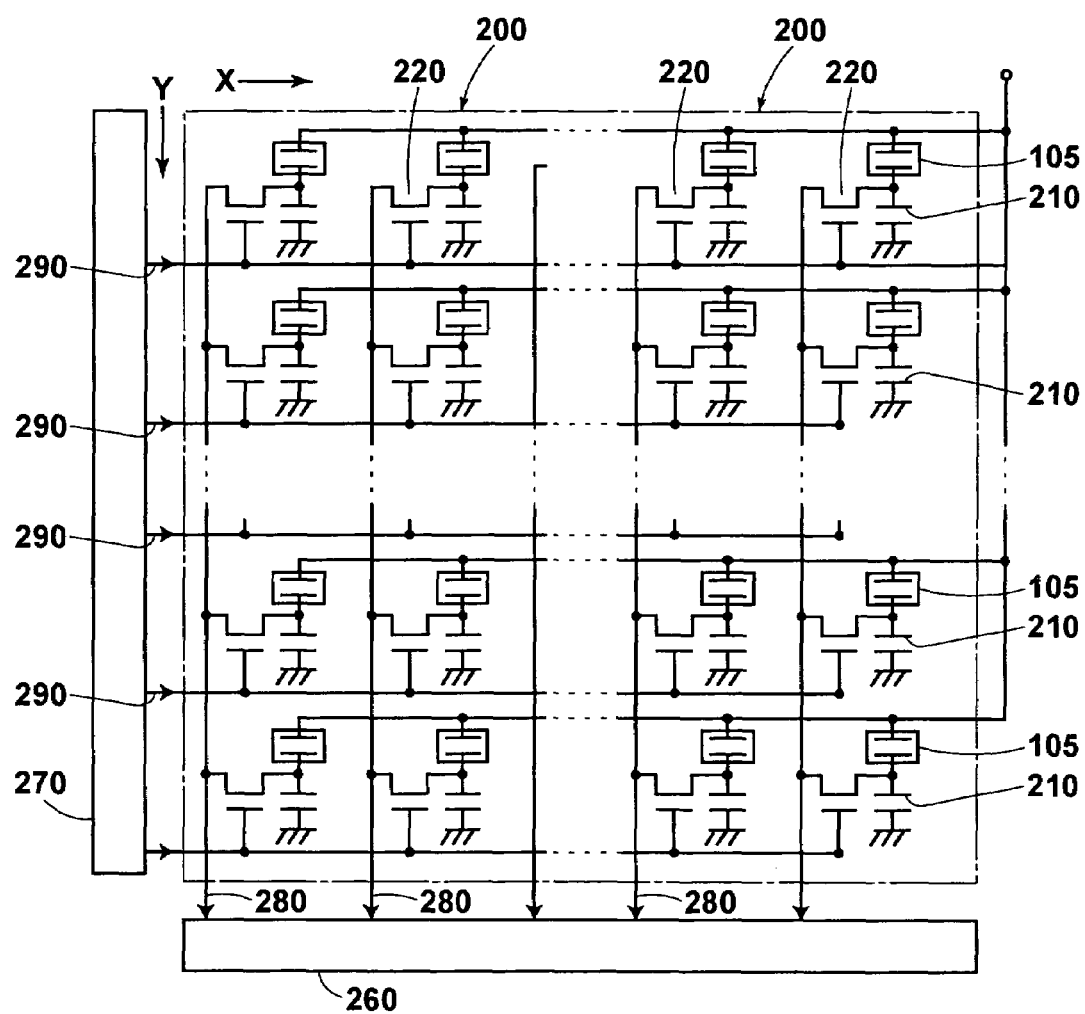
FIG. 8 is an electric circuit diagram showing an equivalent circuit of the AMA substrate.

Constitutions of the respective portions of the AMA substrate 200 will be briefly described. As shown in FIG. 8, in the AMA substrate 200, a capacitor 210 as a charge accumulation capacitor and a TFT 220 as a switching element are provided for each one of radiation detectors 105 corresponding to the pixels. In the support 102, the radiation detectors 105 corresponding to the pixels are two-dimensionally arrayed with a matrix constitution of approximately 1000 to 3000 pieces in the longitudinal direction and approximately 1000 to 3000 pieces in the lateral direction in accordance with the necessary pixels. Moreover, also in the AMA substrate 200, the capacitors 210 and the TFTs 220, which are equal in number to the pixels, are two-dimensionally arrayed with a similar matrix constitution. Charges generated in the photoconductive layer are accumulated in the capacitors 210, and become an electrostatic latent image in accordance with the optical reading system. In the TFT method of the present invention, the electrostatic latent image generated by the radiation is held in the charge accumulation capacitors.

Specific constitutions of the capacitors 210 and the TFTs 220 in the AMA substrate 200 are as shown in FIG. 7. Specifically, an AMA substrate support 230 is an insulator. Moreover, a connection-side electrode 210b of the capacitor 210 and a source electrode 220b and drain electrode 220c of the TFT 220 are formed in a stacked manner above a ground-side electrode 210a of the capacitor 210 and a gate electrode 220a of the TFT 220, the ground-side electrode 210a and the gate electrode 220a being formed on a surface of the AMA substrate support 230, with an insulating film 240 interposed therebetween. In addition, the uppermost surface of the AMA substrate 200 is covered with a protecting insulating film 250. Furthermore, the connection-side electrode 210b and the source electrode 220b are interconnected to be one, and are formed simultaneously. For example, a plasma SiN film is used as the insulating film 240 constituting both of a capacitor insulating film of the capacitor 210 and a gate insulating film of the TFT 220. The AMA substrate 200 described above is manufactured by use of such thin film formation technology and microprocessing technology for use in producing a liquid crystal display substrate.

Subsequently, the joining of the radiation detection unit 100 and the AMA substrate 200 will be described. In a state where the detection electrode 107 and the connection-side electrode 210b of the capacitor 210 are aligned with each other, both of the substrates 100 and 200 are adhered by heating and pressurization to be bonded together while interposing therebetween an anisotropic conductive film (ACF) which contains conductive particles such as silver particles and has conductivity only in a thickness direction thereof. Thus, both of the substrates 100 and 200 are mechanically united together. Simultaneously, the detection electrode 107 and the connection-side electrode 210b are electrically connected to each other by a conductor portion 140 interposed therebetween.

Moreover, in the AMA substrate 200, a reading drive circuit 260 and a gate drive circuit 270 are provided. As shown in FIG. 8, the reading drive circuit 260 is connected to reading wires (reading address lines) 280 in the longitudinal (Y) direction, which interconnect the drain electrodes of the TFTs 220 belonging to the same columns. Moreover, the gate drive circuit 270 is connected to reading lines (gate address lines) 290 in the lateral (X) direction, which interconnect the gate electrodes of the TFTs 220 belonging to the same rows. Note that, though not shown, in the reading drive circuit 260, one preamplifier (charge-voltage converter) is connected to each of the reading wires 280. As described above, the reading drive circuit 260 and the gate drive circuit 270 are connected to the AMA substrate 200. However, one is also used, in which the reading drive circuit 260 and the gate drive circuit 270 are integrally molded in the AMA substrate 200 to achieve integration thereof.

Note that a radiation detection operation by a radiation imaging apparatus in which the above-described radiation detection unit 100 and AMA substrate 200 are joined and united together is described, for example, in Japanese Unexamined Patent Publication No. 11(1999)-287862 and the like.

Examples of the method according to the present invention for manufacturing the photoconductive layer constituting the radiation imaging panel will be described below.

EXAMPLES

Example 1

Bismuth oxide ($Bi_2O_3$) powder and silicon oxide ($SiO_2$) powder were compounded with each other so that a molar ratio thereof became 6:1, and ball mill mixing was performed for an obtained compound in ethanol by using zirconium oxide balls. A mixture thus obtained was collected and dried, followed by temporal firing at 800° C. for 8 hours. In such a way, $Bi_{12}SiO_{20}$ powder was obtained by a solid phase reaction of the bismuth oxide and the silicon oxide. The $Bi_{12}SiO_{20}$ powder was roughly milled in a mortar, and a particle diameter thereof was adjusted to 150 μm or less. Thereafter, by using zirconium oxide balls, the powder was milled and dispersed in ethanol by a ball mill. Note that, in this case, to a mixture thus obtained, 0.4 wt % polyvinyl butyral (PVB) was added as a dispersant which promotes the dispersion. Subsequently, to the mixture, 3.7 wt % PVB was added as a binder, and 0.8 wt % dioctyl phthalate was added as a plasticizer. Furthermore, the milling and the dispersion were then made to continue by the ball mill, and slurry for molding a sheet was prepared. For the collected slurry, deaerating and concentration were performed by a vacuum deaerating treatment, and viscosity thereof was adjusted at 60 poises.

By using a coater, the slurry of which viscosity was adjusted was coated on a film base to which a release agent was applied, and was molded into a sheet shape. A molded body thus obtained was left at room temperature for 24 hours for drying, and was then peeled off from the film base. The molded body thus peeled was placed on a sintered body of aluminum oxide (purity: 95%) in which a content of silicon oxide as a setter was 2.7%, and was then subjected to a binder removing treatment at 470° C., followed by sintering at sintering temperature of 800° C. The sintered body became a sintered body of $Bi_{12}SiO_{20}$ without being fused with the setter. The $Bi_{12}SiO_{20}$ sintered body exhibited good X-ray photoconductivity.

Example 2

A $Bi_{12}SiO_{20}$ sintered body was prepared in completely the same manner as in Example 1 except that aluminum oxide (purity: 99.6%) in which the content of silicon oxide was 0.3% or less was used as the setter. The $Bi_{12}SiO_{20}$ sintered body thus obtained was one which was not fused with the setter. The $Bi_{12}SiO_{20}$ sintered body exhibited good X-ray photoconductivity.

Example 3

A $Bi_{12}SiO_{20}$ sintered body was prepared in completely the same manner as in Example 2 except that the firing temperature was set at 860° C. The $Bi_{12}SiO_{20}$ sintered body thus obtained was one which was not fused with the setter. The $Bi_{12}SiO_{20}$ sintered body exhibited good X-ray photoconductivity.

Example 4

A $Bi_{12}SiO_{20}$ sintered body was prepared in completely the same manner as in Example 3 except that a sintered body of zirconium oxide in which the content of silicon oxide was 0.1% was used as the setter, and that the firing temperature was set at 850° C. The $Bi_{12}SiO_{20}$ sintered body thus obtained was one which was not fused with the setter. The $Bi_{12}SiO_{20}$ sintered body exhibited good X-ray photoconductivity.

Example 5

A $Bi_{12}SiO_{20}$ sintered body was prepared in completely the same manner as in Example 3 except that a sintered body of zirconium oxide in which the content of silicon oxide was 0.005% or less was used as the setter. The $Bi_{12}SiO_{20}$ sintered body thus formed was one which was not fused with the setter. The $Bi_{12}SiO_{20}$ sintered body exhibited good X-ray photoconductivity.

Example 6

A $Bi_{12}SiO_{20}$ sintered body was prepared in completely the same manner as in Example 3 except that single crystal of aluminum oxide was used as the setter. The $Bi_{12}SiO_{20}$ sintered body thus formed was one which was not fused with the setter. The $Bi_{12}SiO_{20}$ sintered body exhibited good X-ray photoconductivity.

Example 7

A $Bi_{12}SiO_{20}$ sintered body was prepared in completely the same manner as in Example 5 except that $GeO_2$ powder was used instead of the $SiO_2$ powder as one of the materials. The $Bi_{12}SiO_{20}$ sintered body thus obtained was one which was not fused with the setter. The $Bi_{12}SiO_{20}$ sintered body exhibited good X-ray photoconductivity.

Example 8

A $Bi_{12}SiO_{20}$ sintered body was prepared in completely the same manner as in Example 5 except that $TiO_2$ powder was used instead of the $SiO_2$ powder as one of the materials. The $Bi_{12}SiO_{20}$ sintered body thus obtained was one which was not fused with the setter. The $Bi_{12}SiO_{20}$ sintered body exhibited good X-ray photoconductivity.

Example 9

A $Bi_{12}TiO_{20}$ sintered body was prepared in the same manner as in Example 8, except that an alumina sintered body having an silicon oxide content of 0.3% or less was employed as the setter. The $Bi_{12}TiO_{20}$ sintered body thus obtained was one which was not fused with the setter. The $Bi_{12}TiO_{20}$ sintered body exhibited good X-ray photoconductivity.

Example 10

A $Bi_{12}TiO_{20}$ sintered body was prepared in the same manner as in Example 9, except that an aluminum oxide single crystal was employed as the setter. The $Bi_{12}TiO_{20}$ sintered body thus obtained was one which was not fused with the setter. The $Bi_{12}TiO_{20}$ sintered body exhibited good X-ray photoconductivity.

Example 11

A $Bi_2O_3$ sintered body was prepared in the same manner as in Example 10, except that bismuth oxide powder was used instead of the $Bi_{12}TiO_{20}$ powder, and that the sintering temperature was set at 720°. The $Bi_2O_3$ sintered body thus obtained was one which was not fused with the setter. The $Bi_2O_3$ sintered body exhibited good X-ray photoconductivity.

Example 12

A $Bi_4Ti_3O_{12}$ sintered body was prepared in the same manner as in Example 10, except that a $Bi_4Ti_3O_{12}$ powder, which was obtained by mixing bismuth oxide powder and titanium oxide powder at a molar ratio of 2:3 then undergoing the same steps as in Example 1, was used, and that the sintering temperature as set at 870°. The $Bi_4Ti_3O_{12}$ sintered body thus obtained was one which was not fused with the setter. The $Bi_4Ti_3O_{12}$ sintered body exhibited good X-ray photoconductivity.

Comparative Example 1

A $Bi_{12}SiO_{20}$ sintered body was prepared in completely the same manner as in Example 1 except that the sintering temperature was set at 850° C. After the sintering treatment, the $Bi_{12}SiO_{20}$ sintered body was fused with the setter.

Comparative Example 2

A $Bi_{12}SiO_{20}$ sintered body was prepared in completely the same manner as in Example 4 except that the sintering temperature was set at 860° C. After the sintering treatment, the $Bi_{12}SiO_{20}$ sintered body was fused with the setter.

Comparative Example 3

A $Bi_{12}SiO_{20}$ sintered body was prepared in completely the same manner as in Example 6 except that a platinum plate was used as the setter. After the sintering treatment, the $Bi_{12}SiO_{20}$ sintered body was fused with the setter.

Comparative Example 4

A $Bi_{12}SiO_{20}$ sintered body was prepared in the same manner as in Example 10, except that aluminum oxide (purity: 95%) having a silicon oxide content of 2.7% was used as the setter. After the sintering treatment, the $Bi_{12}SiO_{20}$ sintered body was fused with the setter.

Comparative Example 5

A $Bi_2O_3$ sintered body was prepared in the same manner as in Example 11, except that aluminum oxide (purity: 95%) having a silicon oxide content of 2.7% was used as the setter. After the sintering treatment, the $Bi_2O_3$ sintered body was fused with the setter.

Comparative Example 6

A $Bi_4TiO_{12}$ sintered body was prepared in the same manner as in Example 12, except that aluminum oxide (purity: 95%) having a silicon oxide content of 2.7% was used as the setter. After the sintering treatment, the $Bi_4TiO_{12}$ sintered body was fused with the setter.

Table 1 shows a summary of Examples 1 through 12 and Comparative examples 1 through 6. Note that, in the fusion column of Table 1, a circle symbol (○) indicates that fusion did not occur, and an x (x) indicates that fusion occurred.

TABLE 1

| | Photoconductive material | Material of setter | | | Firing temperature | Fusion |
|---|---|---|---|---|---|---|
| | | Material | Structure | Content of $SiO_2$ | | |
| Example 1 | $Bi_{12}SiO_{20}$ | $Al_2O_3$ | Sintered body | 2.7% | 800° C. | ○ |
| Example 2 | $Bi_{12}SiO_{20}$ | $Al_2O_3$ | Sintered body | ≦0.3% | 800° C. | ○ |
| Example 3 | $Bi_{12}SiO_{20}$ | $Al_2O_3$ | Sintered body | ≦0.3% | 860° C. | ○ |
| Example 4 | $Bi_{12}SiO_{20}$ | $ZrO_2$ | Sintered body | 0.1% | 850° C. | ○ |
| Example 5 | $Bi_{12}SiO_{20}$ | $ZrO_2$ | Sintered body | ≦0.005% | 860° C. | ○ |
| Example 6 | $Bi_{12}SiO_{20}$ | $Al_2O_3$ | Single crystal | ≦0.001% | 860° C. | ○ |
| Example 7 | $Bi_{12}GeO_{20}$ | $ZrO_2$ | Sintered body | ≦0.005% | 860° C. | ○ |
| Example 8 | $Bi_{12}TiO_{20}$ | $ZrO_2$ | Sintered body | ≦0.005% | 860° C. | ○ |
| Example 9 | $Bi_{12}TiO_{20}$ | $Al_2O_3$ | Sintered body | ≦0.3% | 860° C. | ○ |
| Example 10 | $Bi_{12}TiO_{20}$ | $Al_2O_3$ | Single crystal | ≦0.001% | 860° C. | ○ |
| Example 11 | $Bi_2O_3$ | $Al_2O_3$ | Single crystal | ≦0.001% | 720° C. | ○ |
| Example 12 | $Bi_4Ti_3O_{12}$ | $Al_2O_3$ | Single crystal | ≦0.001% | 870° C. | ○ |
| Comparative Example 1 | $Bi_{12}SiO_{20}$ | $Al_2O_3$ | Sintered body | 2.7% | 850° C. | X |
| Comparative example 2 | $Bi_{12}SiO_{20}$ | $ZrO_2$ | Sintered body | 0.1% | 860° C. | X |
| Comparative example 3 | $Bi_{12}SiO_{20}$ | Pt | Poly-crystal | ≦0.005% | 860° C. | X |

TABLE 1-continued

| | | Material of setter | | | | |
|---|---|---|---|---|---|---|
| | Photoconductive material | Material | Structure | Content of $SiO_2$ | Firing temperature | Fusion |
| Comparative example 4 | $Bi_{12}TiO_{20}$ | $Al_2O_3$ | Sintered body | 2.7% | 860° C. | X |
| Comparative example 5 | $Bi_2O_3$ | $Al_2O_3$ | Sintered body | 2.7% | 720° C. | X |
| Comparative example 6 | $Bi_4Ti_3O_{12}$ | $Al_2O_3$ | Sintered body | 2.7% | 870° C. | X |

As apparent from Table 1, in each of Examples 1 to 3 in which the aluminum oxide sintered body was used as the setter, the $Bi_{12}SiO_{20}$ sintered body was prepared without being fused with the setter. In the case of the aluminum oxide sintered body in which the content of silicon oxide was 2.7%, the fusion occurred at the sintering temperature of 850° C. (Comparative example 1). Meanwhile, in the case of using, as the setter, the aluminum oxide sintered body in which the content of silicon oxide was 0.3% or less, the fusion did not occur even at the sintering temperature of 860° C. (Example 3). Note that the sintering temperature of the $Bi_{12}SiO_{20}$ sintered body of Example 3 was higher than that of the $Bi_{12}SiO_{20}$ sintered body of Example 2, and accordingly, crystallinity in Example 3 was improved owing to a reduction of crystal defects of the sintered body. Therefore, dark current was decreased to one-tenth of that of Example 2.

Moreover, also in each of Examples 4, 5, 7, and 8, which used the zirconium oxide sintered body as the setter, the $Bi_{12}SiO_{20}$ sintered body was prepared without being fused with the setter. Note that, in the case of the zirconium sintered body in which the content of silicon oxide was 0.1%, the fusion occurred when the sintering temperature was as high as 860° C. (Comparative example 2). Meanwhile, in the case of the zirconium oxide sintered body in which the content of silicon oxide was 0.005% or less, the fusion did not occur (Example 5).

Furthermore, in the $Bi_{12}SiO_{20}$ sintered body of Example 5 using, as the setter, the zirconium oxide sintered body in which the content of silicon oxide was 0.005% or less, a quantity of X-ray photocurrent was increased to 1.3 times that of the $Bi_{12}SiO_{20}$ sintered body of Example 3 using the aluminum oxide sintered body in which the content of silicon oxide was 0.3% or less.

Figure 9:
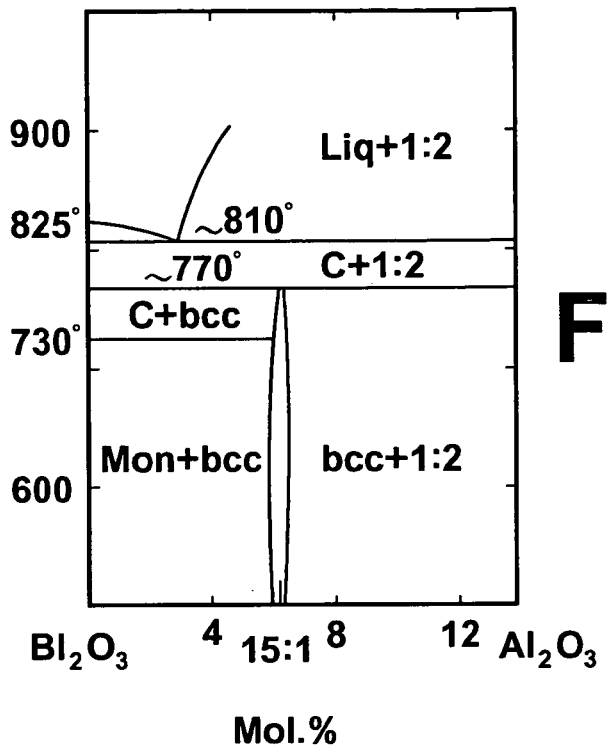
FIG. 9 is a phase diagram of ($Bi_2O_3.Al_2O_3$).
Figure 10:
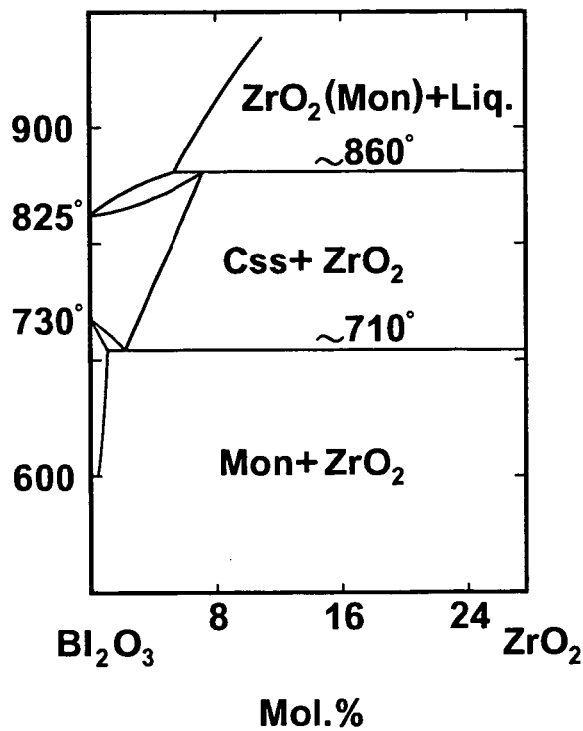
FIG. 10 is a phase diagram of ($Bi_2O_3.ZrO_2$).

The above fact is assumed to occur in the following manner. FIG. 9 and FIG. 10 are phase diagrams of $(Bi_2O_3.Al_2O_3)$ and $(Bi_2O_3.ZrO_2)$, which are excerpted from FIG. 327 and FIG. 328 in Phase Diagrams for Ceramists, E. Levin et al., American Ceramic Society, 1964. In the diagrams, reference symbol ss denotes a solid solution, reference symbol bcc denotes a body centered cubic phase, and reference symbol C denotes cubic $Bi_2O_3$, and reference symbol Mon denotes monoclinic $Bi_2O_3$. According to these diagrams, it is understood that, while a liquid phase of a complex oxide was formed at up to 810° C. in $Bi_2O_3.Al_2O_3$ based on FIG. 9, such a liquid phase of a complex oxide was not formed until the temperature rises to 825° C. or more in $Bi_2O_3.ZrO_2$ based on FIG. 10, that is, zirconium oxide has lower reactivity with bismuth oxide than aluminum oxide has. Hence, when the setter is zirconium oxide, it is conceived that a dispersion and mixing ratio of a component of the zirconium oxide as impurities into the $Bi_{12}SiO_{20}$ sintered body is low, a quantity of the sintered body which causes the crystal defects is restricted, and consequently, the dark current is decreased, and the quantity of X-ray photocurrent is increased.

In Example 6, the aluminum oxide single crystal was used as the setter. Even though the sintering temperature was 860° C., which caused fusion of a platinum setter (refer to Comparative example 3), the $Bi_{12}SiO_{20}$ sintered body did not become fused to the setter in Example 6. The aluminum oxide single crystal has an extremely small content of impurities, and in addition, does not have any grain boundaries. Accordingly, the aluminum oxide is hardly dispersed as impurities into the $Bi_{12}SiO_{20}$, and the quantity of crystal defects generated is restricted to be extremely small. Therefore, the quantity of X-ray photocurrent in this case is increased to 1.4 times that in the case of Example 3 using, as the setter, the aluminum oxide sintered body in which the content of silicon oxide is 0.3% or less.

In Comparative examples 4 through 6, an aluminum oxide sintered body (purity: 95%) having a silicon oxide content of 2.7% was used as the setter. Fusion occurred in all of Comparative examples 4 through 6. However, in Examples 10 through 12, which used single crystal aluminum oxide as the setter, fusion did not occur, and a $Bi_{12}TiO_{20}$ sintered body, a $Bi_2O_3$ sintered body, and a $Bi_4Ti_3O_{12}$ sintered body were obtained, respectively. It was confirmed that Example 10, which used the single crystal aluminum oxide as the setter, exhibited twice the X-ray photoconductivity of Example 9, which used the aluminum oxide sintered body having a silicon oxide content of 0.3% or less as the setter.

As described above, when the photoconductive layer formed of the Bi oxide sintered body is manufactured by using the aluminum oxide sintered body, the zirconium oxide sintered body or the single crystal aluminum oxide, the Bi oxide sintered body can be manufactured without being fused with the setter. Moreover, the content of silicon oxide is set at 1 wt % or less, and further, 0.3 wt % or less, thus making it possible to prepare the Bi oxide sintered body at a higher sintering temperature. As a result, the crystallinity is improved owing to the reduction of the crystal defects of the sintered body, and accordingly, the reduction of the dark current and the increase of the quantity of X-ray photocurrent are expected.

What is claimed is:

1. A method for manufacturing a photoconductive layer consisting essentially of a $Bi_{12}MO_{20}$ sintered body where M is at least one selected from the group consisting of Ge, Si and Ti, the photoconductive layer constituting a radiation imaging panel which records radiation image information as an electrostatic latent image, which method comprises sintering a Bi oxide material disposed on a setter made of an oxide material, wherein the oxide material of the setter is an aluminum oxide sintered body.

2. A method for manufacturing a photoconductive layer consisting essentially of a $Bi_{12}MO_{20}$ sintered body where M is at least one selected from the group consisting of Ge, Si and Ti, the photoconductive layer constituting a radiation imaging panel which records radiation image information as an electrostatic latent image, which method comprises sintering a Bi oxide material disposed on a setter made of an oxide material, wherein the oxide material of the setter is an aluminum oxide sintered body and wherein the content of silicon oxide in the oxide material of the setter is 1 wt % or less.

3. A method for manufacturing a photoconductive layer consisting essentially of a $Bi_{12}MO_{20}$ sintered body where M is at least one selected from the group consisting of Ge, Si and Ti, the photoconductive layer constituting a radiation imaging panel which records radiation image information as an electrostatic latent image, which method comprises sintering a Bi oxide material disposed on a setter made of an oxide material, wherein the oxide material of the setter is an aluminum oxide sintered body and wherein the content of silicon oxide in the oxide material of the setter is 0.3 wt % or less.

4. A method for manufacturing a photoconductive layer consisting essentially of a $Bi_{12}MO_{20}$ sintered body where M is at least one selected from the group consisting of Ge, Si and Ti, the photoconductive layer constituting a radiation imaging panel which records radiation image information as an electrostatic latent image, which method comprises sintering a Bi oxide material disposed on a setter made of an oxide material, wherein the oxide material of the setter is single crystal of aluminum oxide.

* * * * *